US010234986B2

United States Patent
Liu et al.

(10) Patent No.: US 10,234,986 B2
(45) Date of Patent: Mar. 19, 2019

(54) TOUCH CONTROL DISPLAY PANEL AND TOUCH CONTROL DISPLAY APPARATUS

(71) Applicants: Shanghai Tianma Micro-Electronics Co., Ltd., Shanghai (CN); Tianma Micro-Electronics Co., Ltd., Shenzhen (CN)

(72) Inventors: Liang Liu, Shanghai (CN); Feng Lu, Shanghai (CN); Shaolong Ma, Shanghai (CN); Qijun Yao, Shanghai (CN)

(73) Assignees: Shanghai Tianma Micro-Electronics Co., Ltd., Shanghai (CN); Tianma Micro-Electronics Co., Ltd., Shenzhen (CN)

( * ) Notice: Subject to any disclaimer, the term of this patent is extended or adjusted under 35 U.S.C. 154(b) by 0 days.

(21) Appl. No.: 15/489,777

(22) Filed: Apr. 18, 2017

(65) Prior Publication Data

US 2017/0220191 A1    Aug. 3, 2017

(30) Foreign Application Priority Data

Dec. 20, 2016   (CN) .......................... 2016 1 1187180

(51) Int. Cl.
   *G06F 3/045*  (2006.01)
   *G06F 3/041*  (2006.01)
   *H01L 27/32*  (2006.01)

(52) U.S. Cl.
   CPC ............ *G06F 3/0416* (2013.01); *G06F 3/045* (2013.01); *G06F 3/0412* (2013.01); *H01L 27/323* (2013.01); *H01L 27/3246* (2013.01); *G06F 3/0414* (2013.01); *G06F 2203/04105* (2013.01)

(58) Field of Classification Search
   None
   See application file for complete search history.

(56) References Cited

U.S. PATENT DOCUMENTS 9,690,413 B2 *   6/2017   Filiz ..................... G06F 3/0414
2013/0222306 A1   8/2013   Aberg et al.

FOREIGN PATENT DOCUMENTS

CN        204808289 U      11/2015

* cited by examiner

*Primary Examiner* — Brian M Butcher
(74) *Attorney, Agent, or Firm* — Anova Law Group, PLLC

(57) ABSTRACT

A touch control display panel and a touch control display apparatus are provided. The touch control display panel comprises a first substrate having a display region and a non-display region surrounding the display region, wherein the non-display region includes a plurality of sub-non-display regions, and a plurality of first pressure-sensing bridges and at least one second pressure-sensing bridge, wherein a first pressure-sensing bridge and the at least one second pressure-sensing bridge are disposed in two opposing sub-non-display regions. The first pressure-sensing bridge and the at least one second pressure-sensing bridge each includes a first strain direction and a second strain direction. The first strain direction and the second strain direction of the first pressure-sensing bridge form a first pre-determined angle α and a second pre-determined angle β with respect to a first border of the non-display region, respectively.

20 Claims, 10 Drawing Sheets

TOUCH CONTROL DISPLAY PANEL AND TOUCH CONTROL DISPLAY APPARATUS

CROSS-REFERENCES TO RELATED APPLICATIONS

This application claims the priority of Chinese Patent Application No. CN201611187180.4, filed on Dec. 20, 2016, the entire contents of which are incorporated herein by reference.

FIELD OF THE DISCLOSURE

The present disclosure generally relates to the display technology and, more particularly, relates to a touch control display panel and a touch control display apparatus thereof.

BACKGROUND

With the continuous advancement of science and technology, touch control displays have been developed rapidly. Compared to the key input, the touch control displays featured with an easy operation have been widely used in smart, phones, tablet computers, and other similar devices.

To better satisfy customer's demands, the touch control display panels are often configured with a pressure-sensing bridge for detecting pressing pressures, such that the touch control display panels not only detect the touch position, but also measure touch pressures. However, when an existing pressure-sensing bridge is implemented into the touch control display panel, the touch control display panels often have a certain region where a pressing is not detectable when pressed by a user.

The disclosed touch control display panel, and touch control display apparatus are directed to solve one or more problems set forth above and other problems.

BRIEF SUMMARY OF THE DISCLOSURE

One aspect of the present disclosure provides a touch control display panel. The touch control display panel comprises a first substrate having a display region and a non-display region surrounding the display region, wherein the non-display region includes a plurality of sub-non-display regions, and a plurality of first pressure-sensing bridges and at least one second pressure-sensing bridge, wherein a first pressure-sensing bridge and the at least one second pressure-sensing bridge are disposed in two opposing sub-non-display regions. The first pressure-sensing bridge and the at least one second pressure-sensing bridge each includes a first strain direction and a second strain direction. The first strain direction and the second strain direction of the first pressure-sensing bridge form a first pre-determined angle α and a second pre-determined angle β with respect to a first border of the non-display region, respectively. The first strain direction and the second strain direction of the at least one second pressure-sensing bridge form a third pre-determined angle Φ and a fourth pre-determined angle ω with respect to the first border of the non-display region. A line connecting the first pressure-sensing bridge and the at least one second pressure-sensing bridge forms a fifth pre-determined angle γ with respect to the first border. The fifth pre-determined angle γ is configured to be approximately $\alpha-37°\leq\gamma\leq\alpha-22°$.

Another aspect of the present disclosure provides a touch control display apparatus comprising a touch control display panel The touch control display panel comprises a first substrate having a display region and a non-display region surrounding the display region, wherein the non-display region includes a plurality of sub-non-display regions, and a plurality of first pressure-sensing bridges and at least one second pressure-sensing bridge, wherein a first pressure-sensing bridge and the at least one second pressure-sensing bridge are disposed in two opposing sub-non-display regions. The first, pressure-sensing bridge and the at least one second pressure-sensing bridge each includes a first strain direction and a second strain direction. The first strain direction and the second strain direction of the first pressure-sensing bridge forms a first pre-determined angle α and a second pre-determined angle β with respect to a first border of the non-display region, respectively. The first strain direction and the second strain direction of the at least one second pressure-sensing bridge form a third pre-determined angle Φ and a fourth pre-determined angle ω with respect to the first border of the non-display region. A line connecting the first pressure-sensing bridge and the at least one second pressure-sensing bridge forms a fifth pre-determined angle γ with respect to the first border. The fifth pre-determined angle γ is configured to be approximately $\alpha-37°\leq\gamma\leq\alpha-22°$.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts. It should be understood that the exemplary embodiments described herein are only intended to illustrate and explain the present invention and not to limit the present invention. In addition, it should also be noted that, for ease of description, only part, but not all, of the structures associated with the present invention are shown in the accompanying drawings. All other embodiments obtained by those skilled in the art without making creative work are within the scope of the present invention.

The present disclosure will now be described in detail with reference to the accompanying drawings. When illustrating the embodiments of the present disclosure, certain areas of the schematic views of the device structures may be disproportionally enlarged for the convenience of illustration. In addition, the three-dimensional sizes including the length, width, and depth should be included in the actual implementation of the present disclosure.

Figure 1:
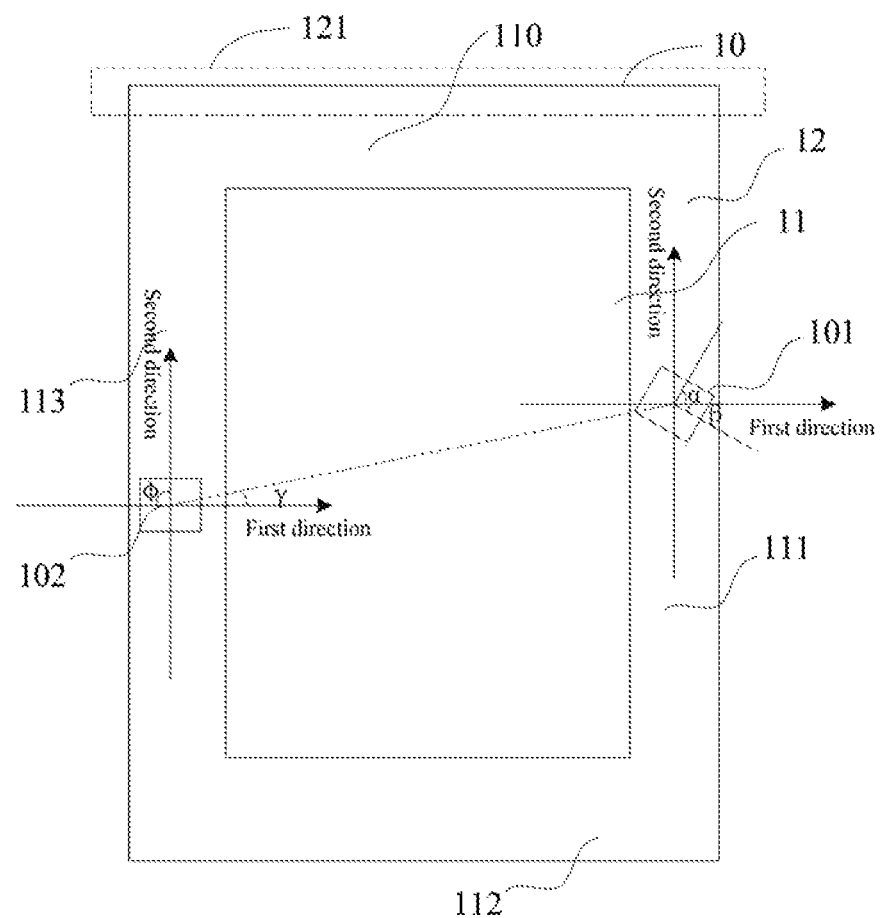
FIG. 1 illustrates a schematic view of an exemplary touch control display panel configured with a pressure-sensing bridge according to the disclosed embodiments.

FIG. 1 illustrates a schematic view of an exemplary touch control display panel configured with a pressure-sensing bridge according to the disclosed embodiments. As shown in FIG. 1, the touch control display panel may include a first substrate 10, a plurality of first pressure-sensing bridges 101, and at least one second pressure-sensing bridge 102. The first substrate 10 may include a display region 11 and a non-display region 12 surrounding the display region 11.

In one embodiment, as shown in FIG. 1, the non-display region 12 may include four sub-non-display regions, such as a first sub-non-display region 110, a second non-sub-display region 111, a third sub-non-display region 112, and a fourth sub-non-display region 113. The first sub-non-display region 110 may be disposed opposite to the third sub-non-display region 112, and the second sub-non-display region 111 may be disposed opposite to the fourth sub-non-display region 113. The number and the arrangement of the sub-non-display regions are for illustrative purposes and are not intended to limit the scope of the present disclosure.

In particular, a first pressure-sensing bridge 101 and a second pressure-sensing bridge 102 may be disposed in two opposing sub-non-display regions, respectively. For example, the first pressure-sensing bridge 101 may be disposed in the first sub-non-display region 110, and the second pressure-sensing bridge 102 may be disposed in the third sub-non-display region 112 arranged opposite to the first sub-non-display region 110 (not shown in FIG. 1). Similarly, the first pressure-sensing bridge 101 may be disposed in the second sun-non-display region 111, and the second pressure-sensing bridge 102 may be disposed in the fourth sub-non-display region 113 arranged opposite to the second sub-non-display region 111 (as shown in FIG. 1).

In the disclosed embodiments, a first pre-determined angle α may be defined as an angle between a first strain direction of the first pressure-sensing bridge 101 and a first border 121 of the non-display region 12 (the first border extends along the first direction in FIG. 1), and a second pre-determined angle β may be defined as an angle between a second strain direction of the first pressure-sensing bridge 102 and the first border 121 of the non-display region 12. Similarly, a third pre-determined angle Φ may be defined as an angle between a first strain direction of the second pressure-sensing bridge 102 and a first border 121 of the non-display region 12, and a fourth pre-determined angle ω may be defined as an angle between a second strain direction of the second pressure-sensing bridge 102 and the first border 121 of the non-display region 12. The first strain direction and second strain direction of a pressure-sensing bridge will be further explained in FIG. 5.

Figure 5:
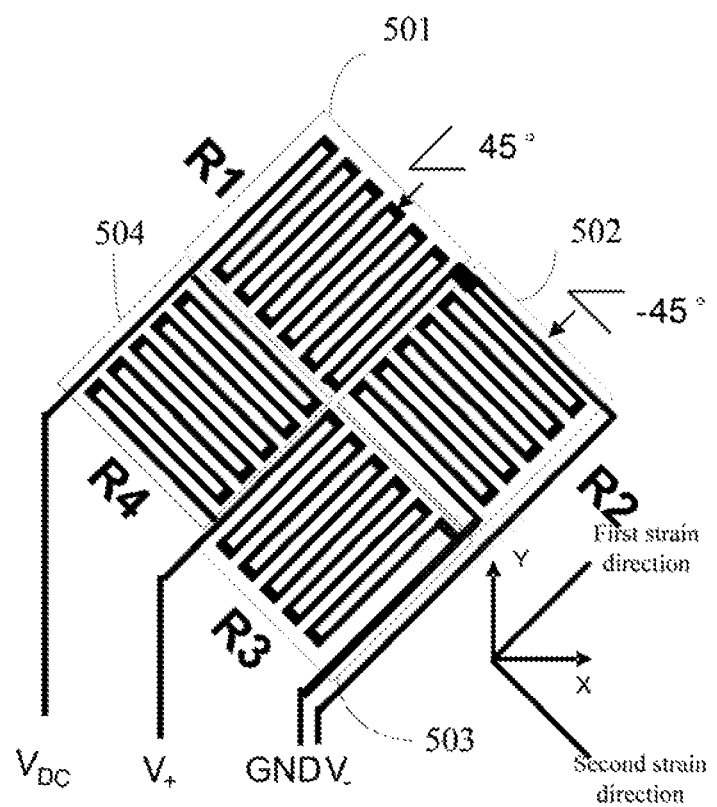
FIG. 5 illustrates a schematic view of an exemplary pressure-sensing bridge according to the disclosed embodiments.

FIG. 5 illustrates a schematic view of an exemplary pressure-sensing bridge according to the disclosed embodiments. Referring to FIG. 5, the pressure-sensing bridge may include four pressure-sensing unit (e.g., resistors) R1, R2, R3 and R4. R1 may be disposed opposite to R3, and R2 may be disposed opposite to R4. The first strain direction of the pressure-sensing bridge may be defined as an extension direction of long edges of the pressure-sensing unit R1 and the pressure-sensing unit R3 in the pressure-sensing bridge, and the second strain direction of the pressure-sensing bridge may be defined as an extension direction of long edges of the pressure-sensing unit R2 and the pressure-sensing unit R4 in the pressure-sensing bridge. The first strain direction may be perpendicular to the second strain direction. The pressure-sensing units may be disposed in an area of the display panel in which the area has negligible temperature difference.

For example, as shown in FIG. 1, the first pre-determined angle α between the first strain direction of the first pressure-sensing bridge 101 and the first border 121 may be about 50°, and the second pre-determined angle β between the second strain direction of the first pressure-sensing bridge 101 and the first border 121 may be about 40°. Similarly, as shown in FIG. 1, the third pre-determined angle Φ between the first strain direction of the second pressure-sensing bridge 102 and the first border 121 may be about 90°, and the fourth pre-determined angle ω not shown in FIG. 1) between the second strain direction of the second pressure-sensing bridge 102 and the first border 121 may be about 0°.

In practical applications, the orientation angles of the first pressure-sensing bridge 101 and the second pressure-sensing bridge 102 may be determined according to the actual requirements. For example, the first pre-determined angle α may be set to the same as or different from the third pre-determined angle Φ.

In one embodiment the first pre-determined angle α and the third pre-determined angle Φ may be greater than or equal to 20° and smaller than or equal to 70°.

Further, in the disclosed embodiments, a fifth pre-determined angle γ may be defined as an angle between a line connecting the first pressure-sensing bridge 101 and the second pressure-sensing bridge 102 and the first border 121. The fifth pre-determined, angle γ may be greater than or equal to the first pre-determined angle α minus 37° and smaller than or equal to the first pre-determined angle α minus 22°. That is, $\alpha-37° \leq \gamma \leq \alpha-22°$.

Figure 2:
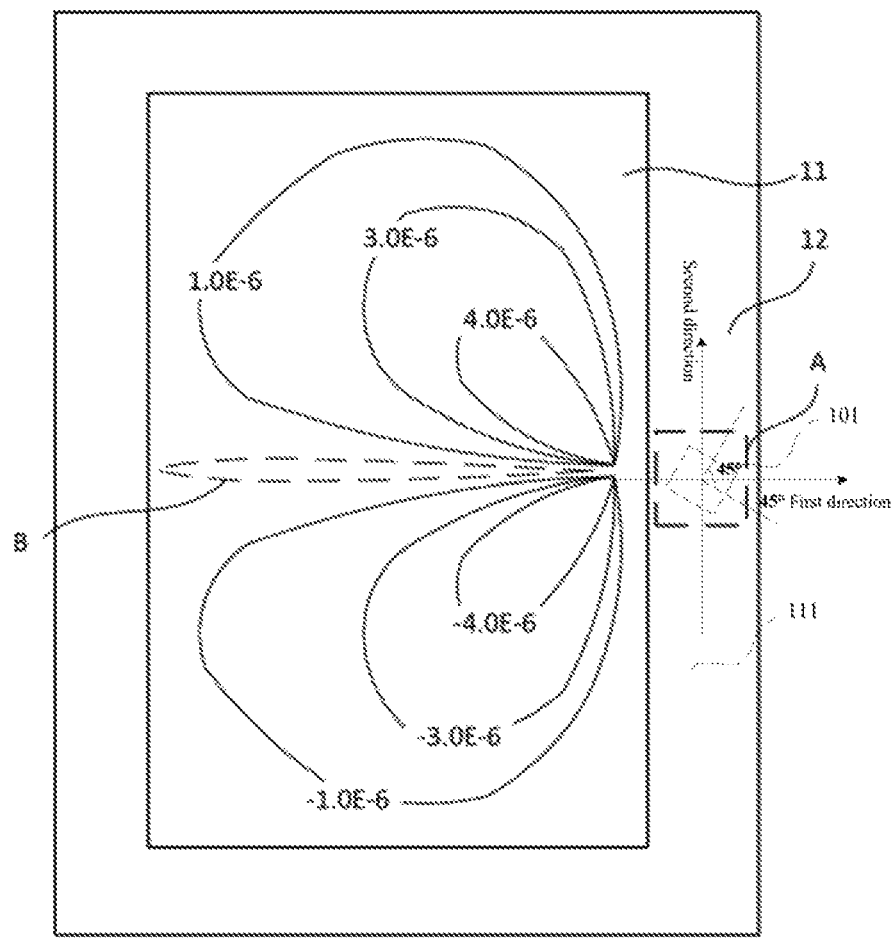
FIG. 2 illustrates a simulated, deformation difference distribution diagram in two test directions for an exemplary touch control display panel subject to full screen pressure testing according to the disclosed embodiments.
Figure 3:
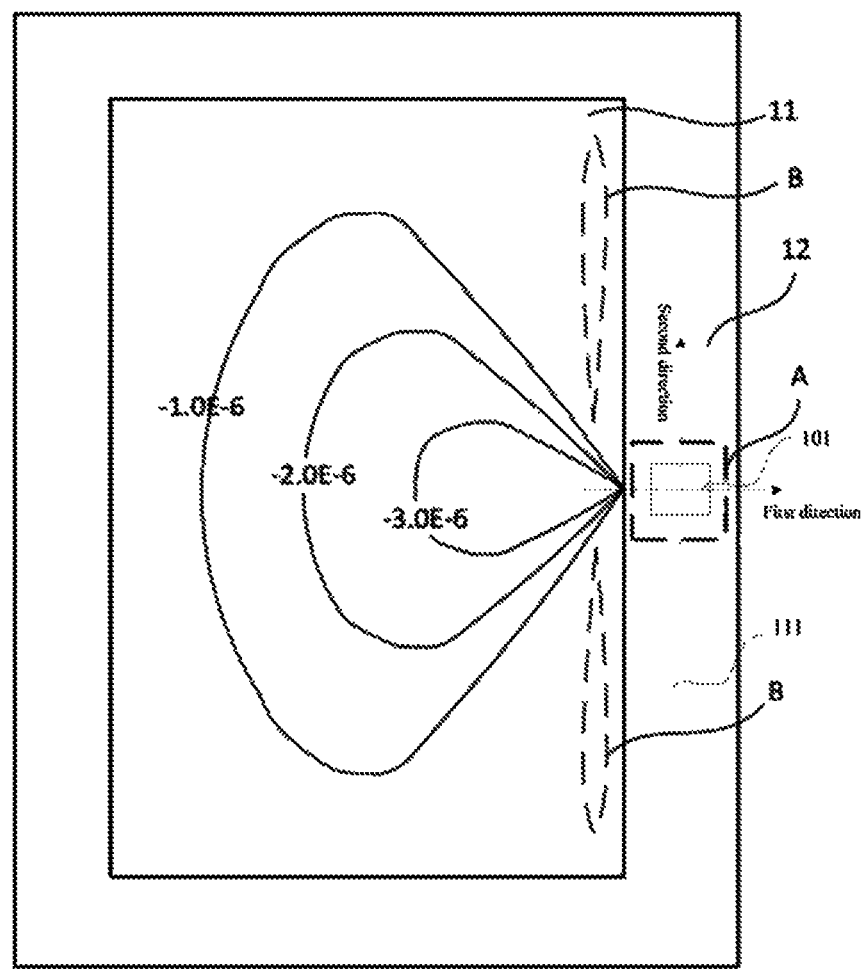
FIG. 3 illustrates a simulated deformation difference distribution diagram in two test directions for another exemplary touch control display panel subject to full screen pressure testing according to the disclosed embodiments.
Figure 4:
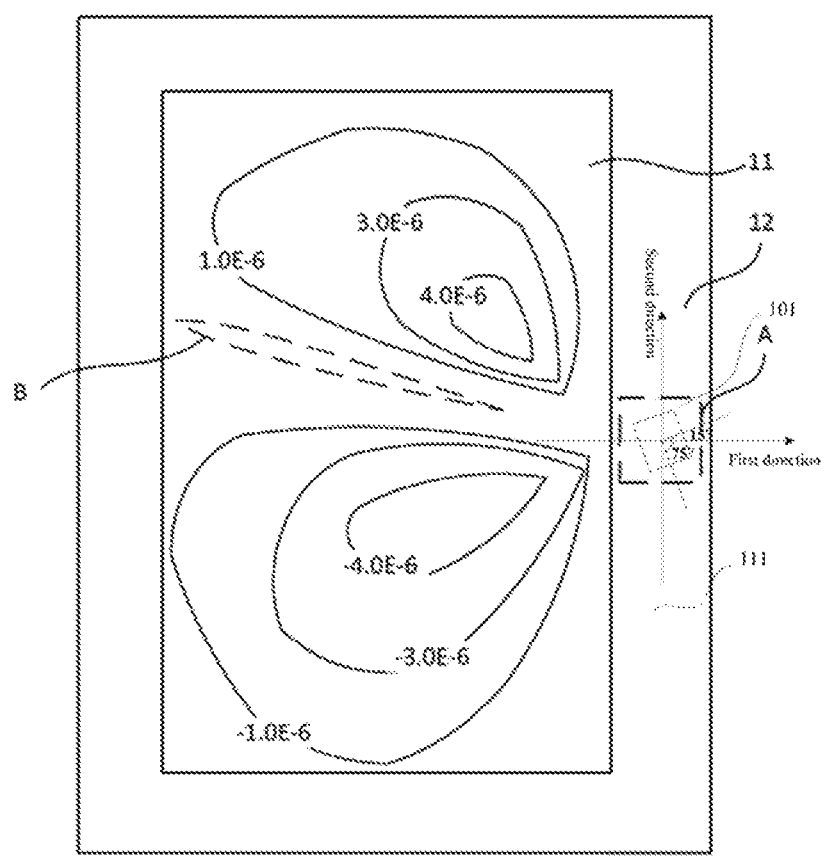
FIG. 4 illustrates a simulated deformation difference distribution diagram in two test directions for another exemplary touch control display panel subject to full screen pressure testing according to fee disclosed embodiments.

FIG. 2, FIG. 3, and FIG. 4 illustrate simulated deformation difference distribution diagrams in two test directions for an exemplary touch control display panel subject to full screen pressure testing according to the disclosed embodiments. As shown in FIG. 2, FIG. 3, and FIG. 4, the first pressure-sensing bridge 101 may be disposed at a position A in the second sub-non-display region 111, and may be oriented differently in FIGS. 2-4. As shown in FIG. 2, the first pre-determined angle α and the second pre-determined angle β of the first pressure-sensing bridge 101 may be configured to be about 45°. As shown in FIG. 3, the first pre-determined angle α of the first pressure-sensing bridge 101 may be configured to be about 90°, and the second pre-determined angle β of the first pressure-sensing bridge 101 may be configured to be about 0°. As shown in FIG. 4, the first pre-determined angle α of the first pressure-sensing bridge 101 may be configured to be about 15°, and the second pre-determined angle β of the first pressure-sensing bridge 101 may be configured to be about 75°.

In FIG. 2, FIG. 3, and FIG. 4, the curves may denote simulated deformation differences detected by the first pressure-sensing bridge 101 in various touch positions on the touch control display panel. That is, the larger the deformation difference, the higher the sensitivity of the pressure-sensing bridge 101. The deformation difference may be a difference between a deformation in the first strain direction and a deformation in the second strain direction. As shown in FIG. 5, the pressure-sensing bridge may include a plurality of pressure-sensing units. The first strain direction may be defined as an extension direction of long edges of a first pressure-sensing unit R1, and the second strain direction may be defined as an extension direction of long edges of a second pressure-sensing unit R2.

As shown in FIG. 2, FIG. 3, and FIG. 4, no matter how the angle between the first pressure-sensing bridge 101 and the first direction changes, there is always a region B (indicated by the dashed line in FIGS. 2-4) where no deformation difference may be detected by the pressure-sensing bridge 101. To detect the deformation difference in the region B, in the disclosed embodiments, as shown in FIG. 1, in addition to the first pressure-sensing bridge 101 disposed in the second sub-non-display region 111, the second pressure-sensing bridge 102 may be disposed in the fourth sub-non-display region 113 arranged opposite to the second sub-non-display region 111.

Thus, the second pressure-sensing bridge 102 may detect the deformation difference in the region B where the deformation difference cannot be detected by the first pressure-sensing bridge 101. The first pressure-sensing bridge 101 and the second pressure-sensing bridge 102 may be coordinated to detect the deformation difference in any position of the entire touch control display panel. The detected deformation difference may be converted into an output voltage. Thus, the pressure signal detection in any position of the touch control display panel may be achieved.

In one embodiment, as shown in FIG. 5, the first pressure-sensing bridge may include a first pressure-sensing unit 501, a second pressure-sensing unit 502, a third pressure-sensing unit 503, and a fourth pressure-sensing unit 504.

The first strain direction of the first pressure-sensing unit 501 and the first strain direction of the third pressure-sensing unit 503 each may form the first pre-determined angle with respect to the first direction X, and the first strain direction of the second pressure-sensing unit 502 and the first strain direction of the fourth pressure-sensing unit 504 each may form the second pre-determined angle with respect to the first direction X.

The present disclosure also provides an exemplary structure of the pressure-sensing units. For example, as shown in FIG. 5, the first pressure-sensing unit 501 may include a first resistor R1. The second pressure-sensing unit 502 may include a second resistor R2. The third pressure-sensing unit 503 may include a third resistor R3. The fourth pressure-sensing unit 504 may include a fourth resistor R4.

A first end of the first resistor R1 and a first end of the fourth resistor R4 may be electrically connected to a first power input terminal $V_{DC}$. A second end of the first resistor R1 and a first end of the second resistor R2 may be electrically connected to a first sensing signal measuring terminal $V_-$. A second end of the fourth resistor R4 and a first end of the third resistor R3 may be electrically connected to a second sensing signal measuring terminal $V_+$. A second end of the second resistor R2 and a second end of the third resistor R3 may be electrically connected to a second power input terminal GND.

The present disclosure also provides an exemplary second pressure-sensing bridge. Similar to the first pressure-sensing bridge, the second pressure-sensing bridge may include a fifth pressure-sensing unit, a sixth pressure-sensing unit, a seventh pressure-sensing unit, and an eighth pressure-sensing unit.

A main strain direction of the fifth pressure-sensing unit and a main strain direction the seventh pressure-sensing unit each may form a third pre-determined angle with respect to the border of the non-display region. A main strain direction of the sixth pressure-sensing unit and a main strain direction the eighth pressure-sensing unit each may form a fourth pre-determined angle with respect to the border of the non-display region.

The present disclosure also provides an exemplary structure of the pressure-sensing unit. The fifth pressure-sensing unit may include a fifth resistor. The sixth pressure-sensing unit may include a sixth resistor. The seventh pressure-sending unit may include a seventh resistor. The eighth pressure-sensing unit may include an eighth resistor.

A first end of the fifth resistor and a first end of the eighth resistor may be electrically connected to a third power input terminal. A second end of the fifth resistor and a first end of the sixth resistor may be electrically connected to a third sensing signal measuring terminal. A second end of the eighth resistor and a first end of the seventh resistor may be electrically connected to a fourth sensing signal measuring terminal. A second end of the sixth resistor and a second end of the seventh resistor may be electrically connected to a fourth power input terminal.

In one embodiment, the first pre-determined angle may be the same as the third pre-determined angle. In another embodiment the first pre-determined angle may be different from the third pre-determined angle.

Figure 6:
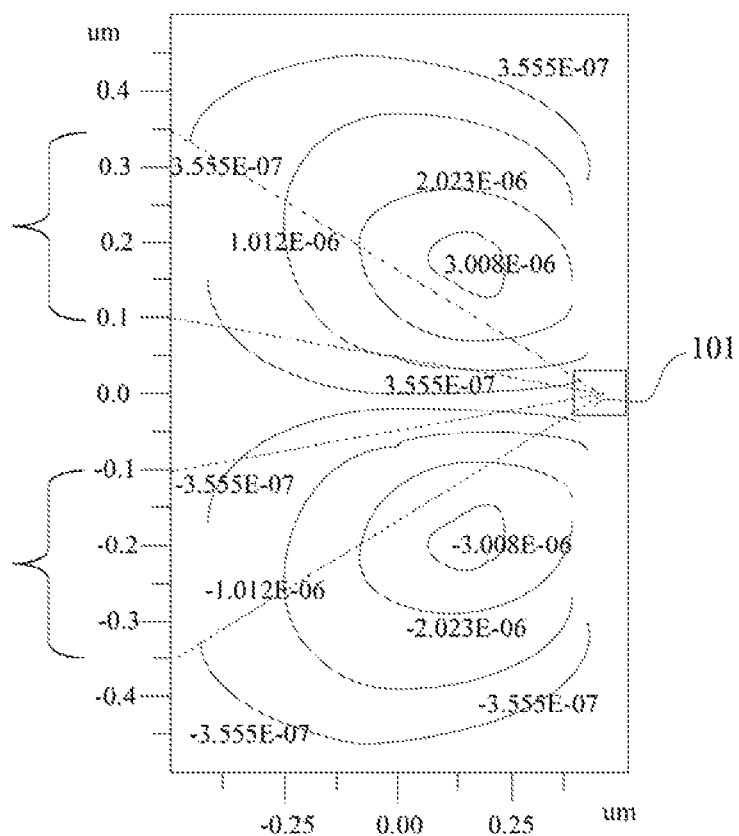
FIG. 6 illustrates a simulated Eyy–Exx distribution diagram sensed by an exemplary pressure-sensing bridge for an exemplary touch control display panel subject to full screen pressure testing according to the disclosed embodiments.

FIG. 6 illustrates a simulated Eyy-Exx distribution diagram sensed by a pressure-sensing bridge for an exemplary touch control display panel subject to full screen pressure testing according to the disclosed embodiments. As shown in FIG. 6, Eyy denotes a deformation value of the pressure-sensing bridge projected on a Y-axis, and Exx denotes a deformation value of the pressure-sensing bridge projected on a X-axis. Eyy-Exx may be the difference between the deformation value projected on the Y-axis and the deformation value projected on the X-axis. The X-axis and the Y-axis denote the axes corresponding to the two strain directions of the pressure-sensing bridge, respectively, rather than the axes corresponding to the long and short sides of the display panel.

For example, when the pressure-sensing bridge is configured to have an orientation angle of about 45°, the X-axis and the Y-axis may form an approximately 45° angle with respect to the short and long sides of the display panel, respectively. Further, the simulation may be performed on the first pressure-sensing bridge in FIG. 5, including four pressure-sensing units, i.e., the First pressure-sensing unit R1, the second pressure-sensing unit R2, the third pressures-sensing unit R3, and the fourth pressure-sensing unit R4.

According to the equation, $$\frac{v_{out}}{v_{in}} = \frac{\Delta R3 - \Delta R4}{4R} + \frac{\Delta R2 - \Delta R1}{4R} = \frac{1}{2} * GF * (E_{xx} - E_{yy}),$$

when a deformation factor GF is 2, $$\frac{v_{out}}{v_{in}} = (E_{yy} - E_{xx}).$$

Generally, the deformation factor GF may be configured to have values close to 2, such as 2.01, 1.98, 1.99, and 2.1, etc. In the disclosed embodiments, for the convenience of illustrations, GF may be configured to be 2. ΔR1, ΔR2, ΔR3, and ΔR4 may be a resistance change due to a pressure applied onto the first pressure-sensing unit R1, the second pressure-sensing unit R2, the third pressure-sensing unit R3, and the fourth pressure-sensing unit R4, respectively.

The resistance of a resistor is determined by resistivity, length, and cross-section area of the resistor. When the resistor is pressed to deform mechanically, the resistivity, the length, and the cross-section area of the resistor change, and the resistance changes accordingly. R denotes a resistance of the first pressure-sensing unit R1, the second pressure-sensing unit R2, the third pressure-sensing unit R3, and the fourth pressure-sensing unit R4. That is, the four pressure-sensing units are configured to have the same resistance R.

As shown in FIG. 5, each pressure-sensing unit may have one input terminal and one output terminal. Vin denotes an input voltage of each pressure-sensing unit, and Vout denotes an output voltage of each pressure-sensing unit. In particular, the first pressure-sensing unit R1 may have an input voltage Vin equal to $V_{DC}$, and an output voltage Vout equal to $V_-$. The second pressure-sensing unit R2 may have an input voltage Vin equal to V−, and an output voltage Vout equal to GND. The third pressure-sensing unit R3 may have an input voltage Vin equal to $V_+$, and an output voltage Vout equal to GND. The fourth pressure-sensing unit R4 may have an input voltage Vin equal to $V_{DC}$, and an output voltage Vout equal to $V_+$.

Assuming that the detection capability or the resolution of the pressure-sensing bridge is about 1 μV. That is, Vout may be 1 μV. When Vin=3.3V, 1 μV/3.3V=3*10$^{-7}$. The pressure-sensing bridge may have the deformation difference Eyy−Exx greater than 3E−7 in the region that can be effectively sensed. Given $$\frac{v_{out}}{v_{in}} = \frac{1}{2} * GF * (E_{xx} - E_{yy}),$$

then 3*10$^{-7}$=½*GF*(E$_{xx}$−E$_{yy}$), where 3E−7 may be the ratio of voltages, and may have no unit. Thus, the unit of the deformation difference Eyy−Exx may be determined by the unit of the deformation factor GF. When the deformation difference Eyy−Exx is multiplied by the deformation factor GF, the units may cancel with each other.

As shown in FIG. 6, when the first pressure-sensing bridge 101 is disposed in the middle of the border on the right hand side of the pressure-sensitive display panel, pressure sensing signals may be detected only in the positions that have the deformation difference Eyy−Exx greater than about 3E−7. That is, the regions highlighted by braces on the left hand side of FIG. 6 may need compensation.

As shown, in FIG. 6, the braces on the left hand side may include ranges between −0.1 and −0.35, and between 0.1 and 0.35, where the coordinate coefficients such as −0.1, −0.2, and −0.4, etc. are relative coefficients. That is, only the first two digits of the deformation difference Eyy−Exx may be considered. For example, the first two digits of the deformation difference 3.55E−7 may be 0.36. The unit on X-axis and Y-axis may be determined by the size of the pressure-sensitive display panel. For example, when the size of the touch control display panel is 5 inches, the long side may be 110 mm, and the short side may be 60 mm. As shown in FIG. 6, the length of the touch control display panel may be divided into ten sections between −0.5 and 0.5. Each section may represent 11 mm divided by the deformation factor GF.

Because the detection integrated circuit (ICs) detects any deformation difference greater than about 0.3, a second pressure-sensing bridge (not shown) may be added on the left hand side of the pressure-sensitive display panel within the ranges highlighted by the braces to compensate the first pressure-sensing bridge 101 for better detection resolution. When the second pressure-sensing bridge is disposed at −0.1, a line connecting the first pressure-sensing bridge 101 and the second pressure-sensing bridge may form an angle of about 8° with respect to the first direction. When the second pressure-sensing bridge is disposed at −0.35, a line connecting the first pressure-sensing bridge 101 and the second pressure-sensing bridge may form an angle of about 23° with respect to the first direction.

As shown in FIG. 6, the first pressure-sensing bridge 101 may have an orientation angle of about 45°. In the disclosed embodiments, referring to the structure in FIG. 1, a fifth pre-determined angle γ may be defined as an angle between the line connection the first pressure-sensing bridge 101 and the second pressure-sensing bridge 102 and the first border. Based on the simulation results, the fifth pre-determined angle γ may be greater than or equal to the first pre-determined angle α minus 37° (i.e., 45°−8°), and smaller than or equal to the first pre-determined, angle minus 22° (i.e., 45°−23°).

Further, when the detection capability of the pressure-sensing bridge improves, for example, when the detection resolution exceeds 1 μV, the detection angle of the first pressure-sensing bridge 101 may expand. That is, when Vout=0.1 μV, and Vin=3.3V, the deformation difference Eyy−Exx in the effective detection region of the first pressure-sensing bridge 101 may be greater than or equal to about 3E−8. That is, 1 μV/3.3V=3*10$^{-8}$. The revised simulation curve may show an enlarged detection angle of the first pressure-sensing bridge 101. For example, the range highlighted by the brace may be between −0.05 and −0.45, That is, the higher the detection resolution of the pressure-sensing bridge 101, the wider the detection angle of the first pressure-sensing bridge 101.

When the position of the first pressure-sensing bridge changes, the angle between the line connecting the first pressure-sensing bridge and the second pressure-sensing bridge and the first direction may change accordingly. That is, when the first pre-determined angle α is changed by δ, the fifth pre-determined angle γ may change accordingly. However, the relative relationship between the first pre-determined angle α and the fifth pre-determined angle γ may remain the same. That is, the fifth pre-determined angle γ may be greater than or equal to the first predetermined angle α minus 37°, and smaller than or equal to the first pre-determined angle α minus 22°.

In the disclosed embodiments, the first pressure-sensing bridge and the second pressure-sensing bridge may be disposed in two opposing sub-non-display regions, such that the second pressure-sensing bridge may detect the pressure-sensing signals in the region where the first pressure-sensing bridge may not detect any pressure-sensing signals. The first pressure-sensing bridge and the second pressure-sensing bridge may complement each other in sensing pressures. That is, by arranging the positions of the pressure-sensing bridges, there may be no position where the pressure-sensing signal is not detected on the touch display panel.

Figure 7:
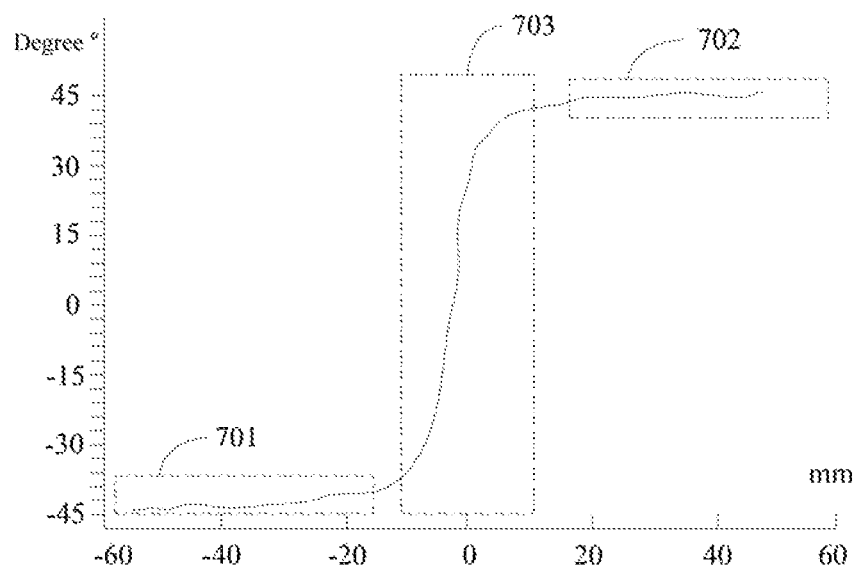
FIG. 7 illustrates a distribution diagram of an angle between a deformation main axis direction and an X-axis direction when pressing a center of an exemplary pressure-sensitive display panel according to the disclosed embodiments.

FIG. 7 illustrates a distribution diagram of an angle between a deformation main axis direction and an X-axis direction when pressing a center of an exemplary pressure-sensitive display panel according to the disclosed embodiments. As shown in FIG. 7, the curve represents the simulated relationship between a pressure-sensing signal output of the pressure-sensing bridge located at a same position with various, orientation angles and the orientation angle.

The direction of the main axis of the strain may be in the vicinity of 45° or −45°. That is, in the regions 701 and 702 in FIG. 7. When in the two regions 701 and 702, the pressure-sensing bridge may have maximum deformation outputs. When in the regions 701 and 702, the deformation difference output may be between 20 and 60 or between −60 and −20. When the orientation angles are in the region 703, the pressure-sensing bridge may have substantially 0 deformation difference output. Thus, in one embodiment, the pressure-sensing bridge may be oriented in a 45° angle with respect to the first direction.

The orientation angle of the pressure-sensing bridge with respect to X-axis, may be configured approximately between 20° and 60°. In the region 703, almost no pressure-sensing signals may be detected. In one embodiment, the pressure-sensing bridge may have the first pre-determined angle to be configured to greater than or equal to about 20° and smaller than or equal to about 60°. In another embodiment, the pressure-sensing bridge may have the first pre-determined angle to be configured to greater than or equal to 20° and smaller than or equal to 70°.

Figure 8:
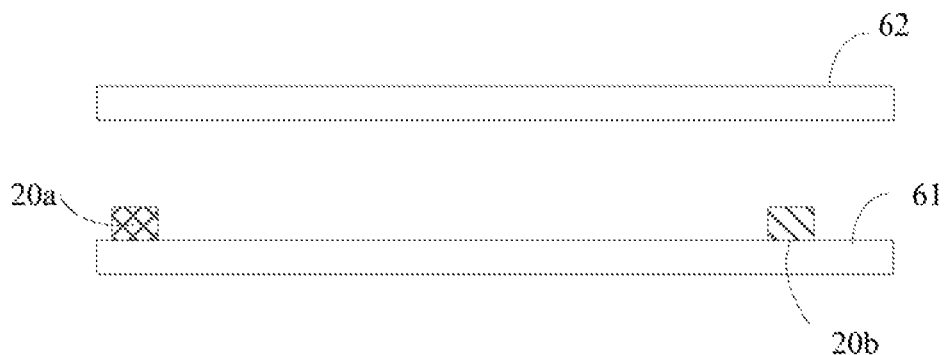
FIG. 8 illustrates a schematic view of an exemplary touch control display panel according to the disclosed embodiments.

FIG. 8 illustrates a schematic view of an exemplary touch control display panel according to the disclosed embodiments. As shown in FIG. 8, the pressure-sensitive display panel may include a first substrate 61, and a second substrate 62 disposed opposite to the first substrate 61. The first substrate 61 may be an array substrate. The second substrate 62 may be a color film substrate. The array substrate 61 may have a first side facing the color film substrate 62 and an opposing side. Two pressure-sensing bridges 20a and 20b may be disposed on the first side of the array substrate 61.

Figure 9:
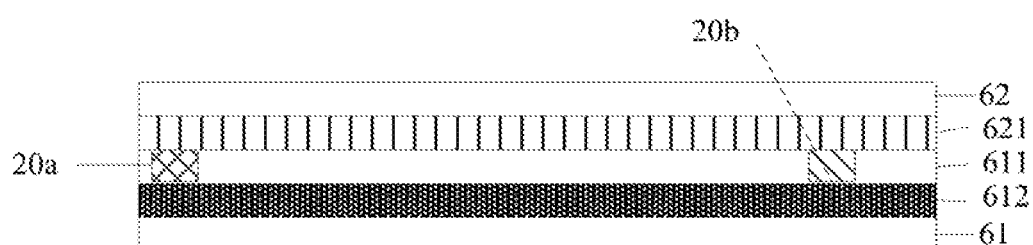
FIG. 9 illustrates a schematic view of another exemplary touch control display panel according to the disclosed embodiments.
Figure 10:
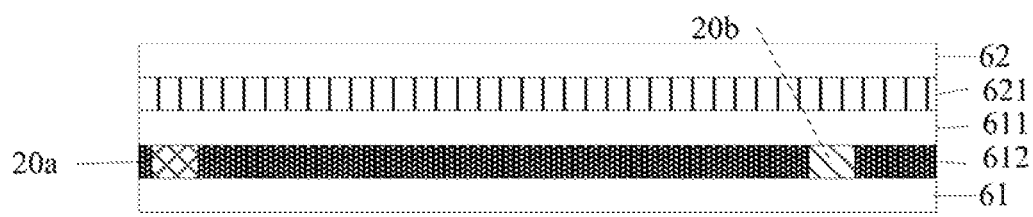
FIG. 10 illustrates a schematic view of another exemplary touch control display panel according to the disclosed embodiments.

FIG. 9 illustrates a schematic view of another exemplary touch control display panel according to the disclosed embodiments. FIG. 10 illustrates a schematic view of another exemplary touch control display panel according to the disclosed embodiments.

As shown in FIG. 9, a common electrode layer 611 and a pixel electrode layer 612 may be formed on the array substrate 61. A color filter layer 621 may be formed on the color film substrate 62.

The common electrode layer 611 may be disposed between the pixel electrode layer 612 and the color filter layer 621. In one embodiment, the pressure-sensing bridges 20a and 20b may be disposed in the common electrode layer 611 as shown in FIG. 9. In another embodiment, the pressure-sensing bridges 20a and 20b may be disposed in the pixel electrode layer 612 as shown in FIG. 10.

Figure 11:
FIG. 11 illustrates a schematic view of another exemplary touch control display panel according to the disclosed embodiments.

FIG. 11 illustrates a schematic view of another exemplary touch control display panel according to the disclosed embodiments. As shown in FIG. 11, the touch control display panel may include a substrate 61, and a second substrate 62 disposed opposite to the first substrate 61. The first substrate 61 may be an array substrate. The second substrate 62 may be a color film substrate. The array substrate 61 may have a first side facing the color film substrate 62 and an opposing side. The pressure-sensing bridges 20a and 20b may be disposed on the opposing side of the first substrate 61.

Figure 12:
FIG. 12 illustrates a schematic view of another exemplary touch control display panel according to the disclosed embodiments.

FIG. 12 illustrates a schematic view of another exemplary touch control display panel according to the disclosed embodiments. As shown in FIG. 12, the touch control display panel may include a substrate 61, and a second substrate 62 disposed opposite to the first substrate 61. The first substrate 61 may be an array substrate. The second substrate 62 may be a color film substrate. The color film substrate 62 may have a first side feeing the array substrate 61 and an opposing side. The pressure-sensing bridges 20a and 20b may be disposed on the opposing side of the color film substrate 62.

Figure 13:
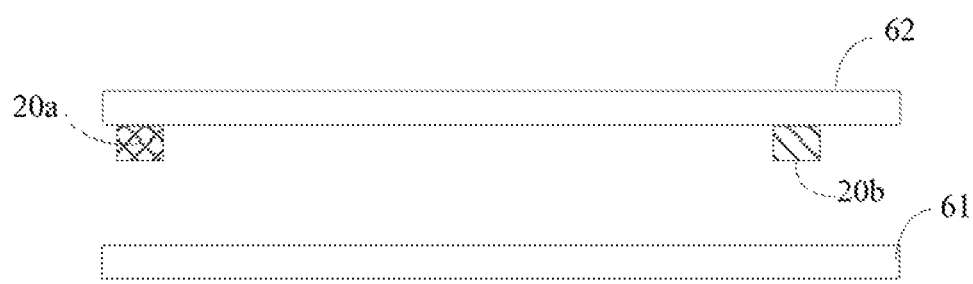
FIG. 13 illustrates a schematic view of another exemplary touch control display panel according to the disclosed embodiments.

FIG. 13 illustrates a schematic view of another exemplary touch control display panel according to the disclosed embodiments. As shown in FIG. 13, the touch control display panel may include a substrate 61, and a second substrate 62 disposed opposite to the first substrate 61. The first substrate 61 may be an array substrate. The second substrate 62 may be a color film substrate. The color film substrate 62 may have a first side facing the array substrate 61 and an opposing side. The pressure-sensing bridges 20a and 20b may be disposed on the first side of the second substrate 62.

Figure 14:
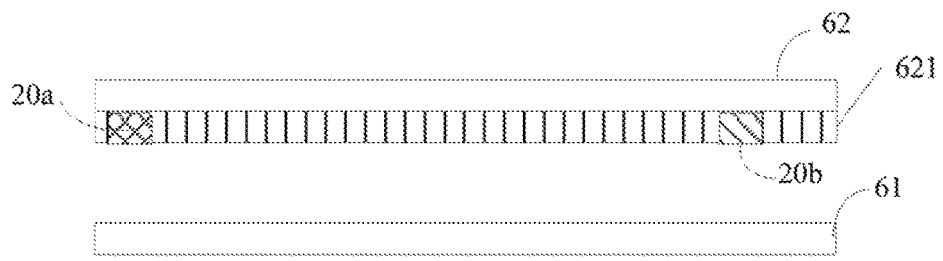
FIG. 14 illustrates a schematic view of another exemplary touch control display panel according to the disclosed embodiments.

FIG. 14 illustrates a schematic view of another exemplary touch control display panel according to the disclosed embodiments. As shown in FIG. 14, the touch control display panel may include a substrate 61, and a second substrate 62 disposed opposite to the first substrate 61. The first substrate 61 may be an array substrate. The second substrate 62 may be a color film substrate. The color film substrate 62 may have a first side facing the array substrate 61 and an opposing side. A color filter layer 621 may be disposed on the first side of the color film substrate 62. The pressure-sensing bridges 20a and 20b may be disposed in the color filter layer 621.

Figure 15:
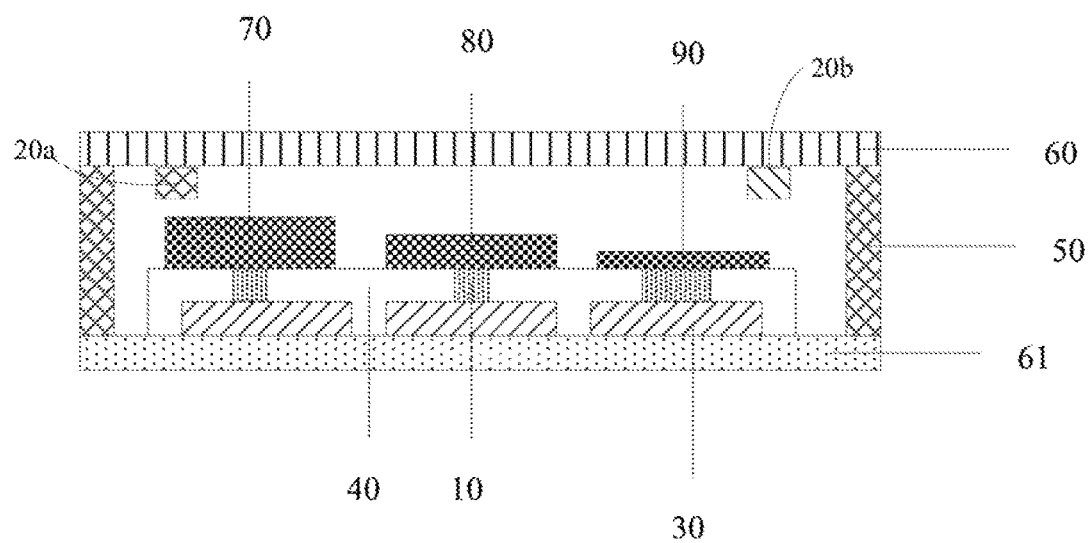
FIG. 15 illustrates a schematic view of another exemplary touch control display panel according to the disclosed embodiments.

FIG. 15 illustrates a schematic view of another exemplary touch control display panel according to the disclosed embodiments. As shown in FIG. 15, the pressure-sensitive display panel may be an organic light-emitting diode (OLED) display panel. The OLED display panel may include an array substrate 61, and a packaging substrate 60 disposed opposing 10 the array substrate 61. The array substrate 61 may have a first side facing the packaging substrate 60 and an opposing side. The packaging substrate 60 may have a first side facing the array substrate 61 and an opposing side. The pressure-sensing bridges 20*a* and 20*b* may be disposed on the first side of the packaging substrate 60.

Further, the OLED display panel may also include a pixel driving circuit 10 and a pixel defining layer 30 formed on the first side of the array substrate 61 opposing to the packaging substrate 60, and a plurality of display pixels formed on the pixel defining layer 30 and connected to the pixel driving circuit 10 through contact electrodes 40. Each display pixel may include a first sub-pixel 70, a second sub-pixel 80, and a third sub-pixel 90. In addition, the OLED display panel may also include frame sealant material 50 and the packaging substrate 60. In one embodiment, the first sub-pixel 70, the second sub-pixel 80, and the third sub-pixel 90 may be a red sub-pixel, a blue sub-pixel, and a green subpixel, respectively. The array substrate 61 may be made of a flexible material.

Figure 16:
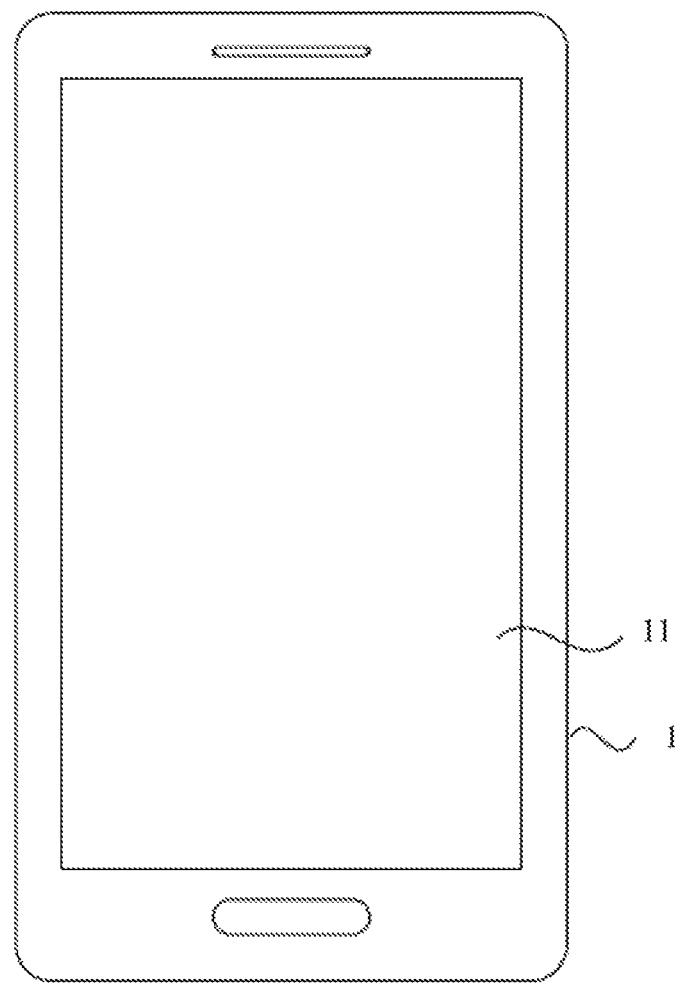
FIG. 16 illustrates a schematic view of an exemplary touch control display apparatus according to the disclosed embodiments.

The present disclosure also provides a touch control display apparatus. FIG. 16 illustrates a schematic view of an exemplary touch control display apparatus according to the disclosed embodiments. As shown in FIG. 16, the touch control display apparatus 1 may include any one of the disclosed touch control display panel 11. Although a smart phone is shown in FIG. 16, the touch control display apparatus 1 may be a smart watch, a VR goggle, a smart hand band, an electronic paper, a television set, an automotive display, a notebook computer, a tablet computer, or any appropriate touch control display apparatus, which is not limited by the present disclosure.

A plurality of first pressure-sensing bridges and at least one second pressure-sensing bridge may be disposed in two opposing sub-non-display regions, respectively. The plurality of first pressure-sensing bridges and the at least second pressure-sensing bridge may be disposed in such a way that the at least one second pressure-sensing bridge may detect the pressure-sensing signals in the region where the plurality of first pressure-sensing bridges may not detect any pressure-sensing signals. The plurality of first pressure-sensing bridges and the at least one second pressure-sensing bridge may complement each other in sensing pressures. That is, by arranging the positions of the pressure-sensing bridges, there may be no position where the pressure-sensing signal is not detected on the touch display panel.

In the disclosed embodiments, the first pressure-sensing bridge and the second pressure-sensing bridge may be disposed in two opposing sub-non-display regions, such that the second pressure-sensing bridge may detect the pressure-sensing signals in the region that the first pressure-sensing bridge may not detect any pressure-sensing signals. The first pressure-sensing bridge and the second pressure-sensing bridge may complement each other in sensing pressures. That is, by arranging the positions of the pressure-sensing bridges, there may be no position where the pressure-sensing signal is not detected on the touch display panel.

It should be noted that the various embodiments in the present specification are described in a progressive manner. Each embodiment is mainly described in terms of differences from the previously described embodiments. The similarities between different embodiments are not repeated, and may be incorporated by references.

Various embodiments have been described to illustrate the operation principles and exemplary implementations. It should be understood by those skilled in the art that the present invention is not limited to the specific embodiments described herein and that various other obvious changes, rearrangements, and substitutions will occur to those skilled in the art without departing from the scope of the invention.

Thus, while the present invention has been described in detail with reference to the above described embodiments, the present invention is not limited to the above described embodiments, but may be embodied in other equivalent forms without departing from the scope of the present invention, which is determined by the appended claims.

What is claimed is:

1. A touch control display panel, comprising:
   a first substrate having a display region and a non-display region surrounding the display region, wherein the non-display region includes a plurality of sub-non-display regions; and
   a plurality of first pressure-sensing bridges and at least one second pressure-sensing bridge, wherein a first pressure-sensing bridge of the plurality of first pressure-sensing bridges and the at least one second pressure-sensing bridge are disposed in two opposing sub-non-display regions,
   wherein:
   the first pressure-sensing bridge and the at least one second pressure-sensing bridge each includes a first strain direction and a second strain direction;
   the first strain direction and the second strain direction of the first pressure-sensing bridge form a first pre-determined angle $\alpha$ and a second pre-determined angle $\beta$ with respect to a first border of the non-display region, respectively;
   the first strain direction and the second strain direction of the at least one second pressure-sensing bridge form a third pre-determined angle $\Phi$ and a fourth pre-determined angle $\omega$ with respect to the first border of the non-display region;
   a line connecting the first pressure-sensing bridge and the at least one second pressure-sensing bridge forms a fifth pre-determined angle $\gamma$ with respect to the first border; and
   the fifth pre-determined angle $\gamma$ is configured to be approximately $\alpha-37° \leq \gamma \leq \alpha-22°$.

2. The touch control display panel according to claim 1, wherein:
   the first pre-determined angle $\alpha$ is configured to be approximately $20° \leq \alpha \leq 70°$; and
   the third pre-determined angle $\Phi$ is configured to be approximately $20° \leq \Phi \leq 70°$.

3. The touch control display panel according to claim 2, wherein:
   the first pressure-sensing bridge includes a first pressure-sensing unit, a second pressure-sensing unit, a third pressure-sensing unit, and a fourth pressure-sensing unit;
   a main strain direction of the first pressure-sensing unit and a main strain direction of the third pressure sensing unit each forms the first pre-determined angle $\alpha$ with respect to the first border of the non-display region; and
   a main strain direction of the second pressure-sensing unit and a main strain direction of the fourth pressure-sensing unit each forms the second pre-determined angle $\beta$ with respect to the first border of the non-display region.

4. The touch control display panel according to claim 3, wherein:
   the first pressure-sensing unit includes a first resistor;
   the second pressure-sensing unit includes a second resistor;
   the third pressure-sensing unit includes a third resistor;
   the fourth pressure-sensing unit includes a fourth resistor;

a first end of the first resistor and a first end of the fourth resistor are electrically connected to a first power input terminal;

a second end of the first resistor and a first end of the second resistor are electrically connected to a first pressure-sensing signal measuring terminal;

a second end of the fourth resistor and a first end of the third resistor are electrically connected to a second pressure-sensing signal measuring terminal; and a second end of the second resistor and a second end of the third resistor are electrically connected to a second power input terminal.

5. The touch control display panel according to claim 3, wherein:

the second pressure-sensing bridge includes a fifth pressure-sensing unit, a sixth pressure-sensing unit, a seventh pressure-sensing unit, and an eighth pressure-sensing unit;

a main strain direction of the fifth pressure-sensing unit and a main strain direction of the seventh pressure sensing unit each forms the third pre-determined angle Φ with respect to the first border of the non-display region; and the main strain direction of the sixth pressure-sensing unit and the main strain direction of the eighth pressure-sensing unit each forms the fourth pre-determined angle ω with respect to the first border of the non-display region.

6. The touch control display panel according to claim 5, wherein:

the fifth pressure-sensing unit includes a fifth resistor;
the sixth pressure-sensing unit includes a sixth resistor;
the seventh pressure-sensing unit includes a seventh resistor;
the eighth pressure-sensing unit includes an eighth resistor;

a first end of the fifth resistor and a first end of the eighth resistor are electrically connected to a third power input terminal;

a second end of the fifth resistor and a first end of the sixth resistor are electrically connected to a third pressure-sensing signal measuring terminal;

a second end of the eighth resistor and a first end of the seventh resistor are electrically connected to a fourth pressure-sensing signal measuring terminal; and a second end of the sixth resistor and a second end of the seventh resistor are electrically connected to a fourth power input terminal.

7. The touch control display panel according to claim 2, wherein:

the first pre-determined angle α is configured to be approximately 45°; and the fifth pre-determined angle γ is configured to be approximately 8°≤γ≤23°.

8. The touch control display panel according to claim 2, wherein:

the first pre-determined angle α is the same as the third pre-determined angle Φ.

9. The touch control display panel according to claim 2, wherein:

the first pre-determined angle α is different from the third pre-determined angle Φ.

10. The touch control display panel according to claim 2, further comprising a second substrate disposed opposite to the first substrate, wherein:

the first substrate is an array substrate;
the second substrate is a color film substrate;
the array substrate has a first side facing the color film substrate and an opposing side; and the first pressure-sensing bridge and the at least one second pressure-sensing bridge are disposed on the first side of the array substrate.

11. The touch control display panel according to claim 10, wherein:

the array substrate comprises a common electrode layer and a pixel electrode layer;

the color film substrate comprises a color filter layer;
the common electrode layer is disposed between the pixel electrode layer and the color filter layer; and the first pressure-sensing bridge and the at least one second pressure-sensing bridge are disposed in the common electrode layer or in the pixel electrode layer.

12. The touch control display panel according to claim 2, further comprising a second substrate disposed opposite to the first substrate, wherein:

the first substrate is an array substrate;
the second substrate is a color film substrate;
the array substrate has a first side facing the color film substrate and an opposing side; and the first pressure-sensing bridge and the at least one second pressure-sensing bridge are disposed on the opposing side of the array substrate.

13. The touch control display panel according to claim 12, wherein:

the array substrate comprises a common electrode layer and a pixel electrode;

the color film substrate comprises a color filter layer;
the common electrode layer is disposed coplanar with the pixel electrode layer; and the first pressure-sensing bridge and the at least one second pressure-sensing bridge are disposed in the common electrode layer.

14. The touch control display panel according to claim 2, further comprising a second substrate disposed opposite to the first substrate, wherein:

the first substrate is an array substrate;
the second substrate is a color film substrate;
the color film substrate has a first side facing the array substrate and an opposing side; and the first pressure-sensing bridge and the at least one second pressure-sensing bridge are disposed on the first side or the opposing side of the color film substrate.

15. The touch control display panel according to claim 14, wherein:

the color film substrate comprises a color filter layer; and
the pressure-sensing bridge is disposed in the color filter layer.

16. A touch control display apparatus, comprising a touch control display panel, wherein the touch control display panel comprises:

a first substrate having a display region and a non-display region surrounding the display region, wherein the non-display region includes a plurality of sub-non-display regions; and a plurality of first pressure-sensing bridges and at least one second pressure-sensing bridge, wherein a first pressure-sensing bridge of the plurality of first pressure-sensing bridges and the at least one second pressure-sensing bridge are disposed in two opposing sub-non-display regions, wherein:

the first pressure-sensing bridge and the at least one second pressure-sensing bridge each includes a first strain direction and a second strain direction;

the first strain direction and the second strain direction of the first pressure-sensing bridge form a first pre-determined angle α and a second pre-determined angle β with respect to a first border of the non-display region, respectively;

the first strain direction and the second strain direction of the at least one second pressure-sensing bridge form a third pre-determined angle Φ and a fourth pre-determined angle ω with respect to the first border of the non-display region;

a line connecting the first pressure-sensing bridge and the at least one second pressure-sensing bridge forms a fifth pre-determined angle γ with respect to the first border; and the fifth pre-determined angle γ is configured to be approximately α−37°≤γ≤α−22°.

17. The touch control display apparatus according to claim 16, wherein:

the first pre-determined angle α is configured to be approximately 20°≤α≤70°; and the third pre-determined angle Φ is configured to be approximately 20°≤Φ≤70°.

18. The touch control display apparatus according to claim 17, wherein:

the first pre-determined angle α is configured to be approximately 45°; and the fifth pre-determined angle γ is configured to be approximately 8≤γ≤23°.

19. The touch control display apparatus according to claim 17, wherein:

the first pre-determined angle α is the same as the third pre-determined angle Φ.

20. The touch control display apparatus according to claim 17, wherein:

the first pre-determined angle α is different from the third pre-determined angle Φ.

\* \* \* \* \*